(12) United States Patent
Wang et al.

(10) Patent No.: US 10,964,582 B2
(45) Date of Patent: Mar. 30, 2021

(54) TRANSFER SUBSTRATE UTILIZING SELECTABLE SURFACE ADHESION TRANSFER ELEMENTS

(71) Applicant: Palo Alto Research Center Incorporated, Palo Alto, CA (US)

(72) Inventors: Yunda Wang, Milpitas, CA (US); Sourobh Raychaudhuri, Mountain View, CA (US); JengPing Lu, Fremont, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 16/449,844

(22) Filed: Jun. 24, 2019

(65) Prior Publication Data

US 2020/0402831 A1 Dec. 24, 2020

(51) Int. Cl.
  *H01L 21/683* (2006.01)
  *B65G 47/90* (2006.01)
  *H01L 25/075* (2006.01)
  *H01L 33/62* (2010.01)

(52) U.S. Cl.
  CPC .......... *H01L 21/6835* (2013.01); *B65G 47/90* (2013.01); *H01L 25/0753* (2013.01); *H01L 33/62* (2013.01); *H01L 2221/68322* (2013.01); *H01L 2221/68354* (2013.01); *H01L 2221/68363* (2013.01); *H01L 2933/0066* (2013.01)

(58) Field of Classification Search
  None
  See application file for complete search history.

(56) References Cited

U.S. PATENT DOCUMENTS

| | | | |
|---|---|---|---|
| 9,412,727 B2 | 8/2016 | Menard et al. | |
| 9,496,155 B2 | 11/2016 | Menard et al. | |
| 2005/0155699 A1 | 7/2005 | Hayashi et al. | |
| 2008/0071044 A1* | 3/2008 | Keite-Telgenbuscher | ................... C09J 133/14 525/479 |
| 2013/0130440 A1* | 5/2013 | Hu | ...................... H01L 33/0093 438/107 |

(Continued)

OTHER PUBLICATIONS

Qui et a., "Bistable electroactive polymer with sharp rigid-to-rubbery phase transition", Proc. SPIE 9798, Electroactive Polymer Actuators and Devices (EAPAD) 2016, 97981U (Apr. 15, 2016). (Year: 2016).*

(Continued)

*Primary Examiner* — Asok K Sarkar
(74) *Attorney, Agent, or Firm* — Mueting Raasch Group

(57) ABSTRACT

An apparatus includes a transfer substrate with two or more transfer elements. Each of the transfer elements includes an adhesion element having a first surface adhesion at a first temperature and a second surface adhesion at a second temperature. The second surface adhesion less than the first surface adhesion. Each transfer element has a thermal element operable to change a temperature of the adhesion element in response to an input. A controller is coupled to provide the inputs to the thermal elements of the two or more transfer elements to cause a subset of the transfer elements to selectably hold objects to and release the objects from the transfer substrate in response to changes between the first and second surface adhesion of the subset of the transfer elements.

21 Claims, 9 Drawing Sheets

(56) References Cited

U.S. PATENT DOCUMENTS

| | | |
|---|---|---|
| 2013/0210194 A1 | 8/2013 | Bibl et al. |
| 2015/0344755 A1* | 12/2015 | Schneider ............... B32B 15/08 |
| | | 428/164 |
| 2017/0215280 A1 | 7/2017 | Chaji |
| 2017/0358478 A1 | 12/2017 | Thothadri et al. |
| 2019/0043416 A1 | 2/2019 | Lee et al. |
| 2020/0243575 A1* | 7/2020 | Wild ................. H01L 29/78603 |

OTHER PUBLICATIONS

Office Action dated Sep. 25, 2020 from EP Application No. 20180961.3, 9 pages.

* cited by examiner

TRANSFER SUBSTRATE UTILIZING SELECTABLE SURFACE ADHESION TRANSFER ELEMENTS

SUMMARY

The present disclosure is directed to a transfer substrate that utilizes selectable surface adhesion element. In one embodiment, an apparatus includes a transfer substrate with two or more transfer elements. Each of the transfer elements includes an adhesion element having a first surface adhesion at a first temperature and a second surface adhesion at a second temperature. The second surface adhesion less than the first surface adhesion. Each transfer element has a thermal element operable to change a temperature of the adhesion element in response to an input. A controller is coupled to provide the inputs to the thermal elements of the two or more transfer elements to cause a subset of the transfer elements to selectably hold objects to and release the objects from the transfer substrate in response to changes between the first and second surface adhesion of the subset of the transfer elements.

In another embodiment, A method involves applying first inputs to a subset of a plurality of transfer elements on a transfer substrate. Each of the plurality of transfer elements has a thermal element and an adhesion element thermally coupled to the adhesion element. The first inputs cause each transfer element in the subset of transfer elements to achieve a first temperature such that each adhesion element of each transfer element in the subset achieves a first surface adhesion. Other transfer elements not in the subset are at a second temperature that causes each adhesion element of the other transfer elements to achieve a second surface adhesion less than the first surface adhesion. At least the subset of the transfer elements is caused to contact a respective subset of objects of a plurality of objects on a donor substrate. The transfer substrate is moved away from the donor substrate. The subset of objects adhere to the subset of transfer elements at the first surface adhesion and move with the transfer substrate. The subset of objects on the transfer substrate are caused to contact a target substrate, and the subset of objects are transferred from the transfer substrate to the target substrate.

In another embodiment, a method involves causing a plurality of transfer elements to contact a corresponding plurality of objects on a donor substrate. Each of the transfer elements includes an adhesion element having a first surface adhesion at a first temperature and a second surface adhesion at a second temperature. The second surface adhesion is less than the first surface adhesion. The transfer elements also each include a thermal element operable to change a temperature of the adhesion element. First inputs are applied to the thermal elements of a subset of a plurality of the transfer elements, causing the adhesion element of each transfer element in the subset of transfer elements to achieve the first surface adhesion. The adhesion element of other transfer elements not in the subset are the second surface adhesion. The transfer substrate is moved away from the donor substrate such that a corresponding subset of objects adhere to the subset of transfer elements and move with the transfer substrate. The subset of objects on the transfer substrate are caused to contact a target substrate. The subset of objects are transferred from the transfer substrate to the target substrate.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures. The drawings are not necessarily to scale.

DETAILED DESCRIPTION

Figure 2:
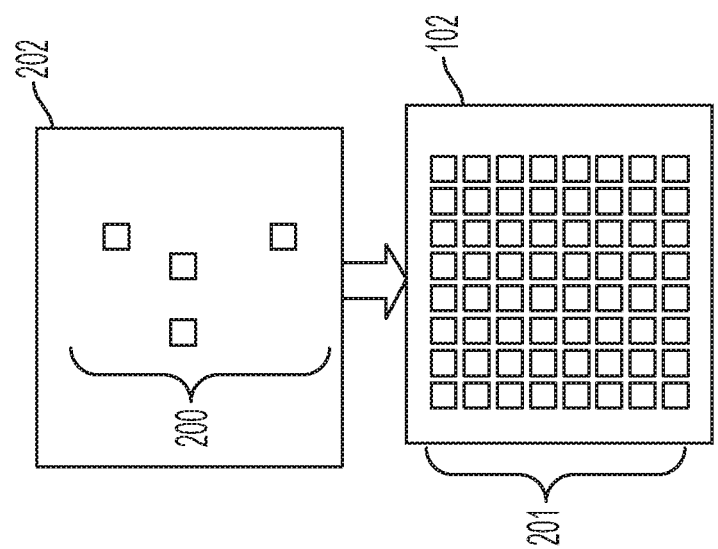
FIGS. 1 and 2 are block diagrams showing an assembly process according to an example embodiment.

The present disclosure relates to manipulation and assembly of objects, and in some embodiments the mass assembly of micro-objects via a transfer substrate. Some electronic devices are fabricated by mechanically overlaying small objects on top of each other. While micro-electronic and micro-optical components are sometimes manufactured using wafer formation techniques such as layer deposition, masking, and etching, certain classes of materials are not growth-compatible with each other. In such a case, the assembly may involve forming one class of devices on a first substrate and a second class of devices on a second substrate, and then mechanically joining them, e.g., via flip-chip or transfer printing techniques.

Aspects described herein relate to a system that is capable of transferring large number of micro objects (e.g., particles/chiplets/mini- or micro-LED dies) from a donor substrate to another substrate in parallel while maintaining high position registration of the individual micro objects. This system allows selectively transferring of micro objects from a transfer substrate and selectively place the micro objects to the destination or target substrate. This system may be used for assembling devices such as microLED displays.

Generally, microLED displays are made with arrays of microscopic LEDs forming the individual transfer elements. Along with OLEDs, microLEDs are primarily aimed at small, low-energy mobile devices. Both OLED and microLED offer greatly reduced energy requirements compared to conventional LCD systems. Unlike OLED, microLED is based on conventional GaN LED technology, which offers higher total brightness than OLED produces, as well as higher efficiency in terms of light emitted per unit of power. It also does not suffer from the shorter lifetimes of OLED.

A single 4K television utilizing microLED has ~25 million small LED subpixels that then need to be assembled. Mass transfer of chiplets is one technology that may be used for microLED manufacturing. Transferring microLED to a target backplane quickly and accurately with a high yield will be one of the techniques that manufacturers need to perfect in order for microLED to be a viable mass-market product. The techniques described below can be used for microLED manufacture, as well as other assembly procedures in which a large number of (typically) small objects need to be moved at once, and where it may be necessary to selectively move a subset of such device to and/or from the transfer media. Such micro objects may include but not limited to inks, pre-deposited metal films, silicon chips, integrated circuit chips, beads, microLED dies, micro-electro-mechanical system (MEMS) structures, and any other pre-fabricated micro structures.

Being able to selectively transfer chiplets in an arbitrary pattern is useful to facilitate the effective transfer process, pixel repair, hole/vacancy refill for microLED display manufacturing, which will lead to high process yield. An elastomer stamp has been used to deterministically transfer microscale LED chips for this type of application. However, an elastomer stamp has fixed pattern and cannot transfer arbitrary pattern of chiplets. Inevitably, some subset of the chiplets will be defective, and therefore it becomes difficult to replace a select few of them using such a stamp.

Figure 1:
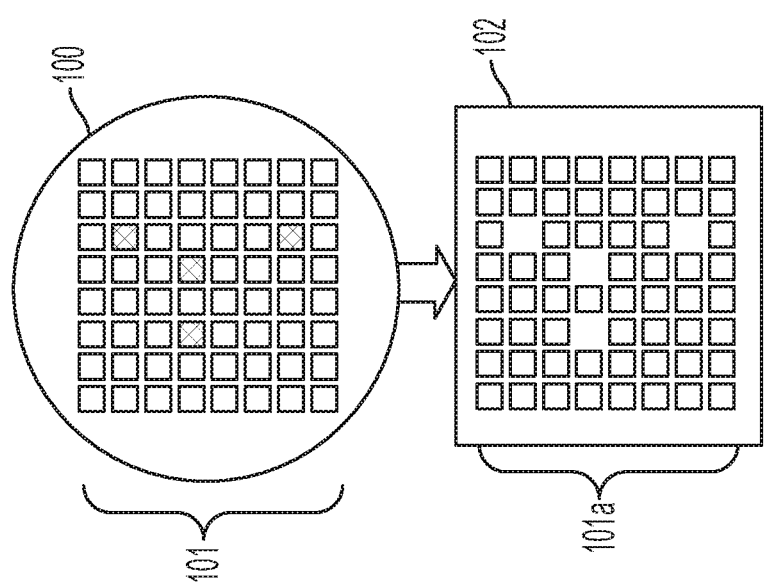

In FIGS. 1 and 2, block diagrams show an example of an assembly process that can be achieved using devices, systems, and methods according to an example embodiment. In FIG. 1, a donor wafer/substrate 100 is shown that includes an array of chiplets 101 that may have been grown or placed on the substrate 100. The shaded chiplets in the array 101 have been identified as defective, and when the chiplets are transferred to a target substrate 102, only a subset 101a of the chiplet array are transferred, namely the good chiplets that are not shaded. This may be achieved with a transfer substrate 200 as shown in FIG. 2 that can selectively pick up just the subset 101a from the donor substrate 100 once they are identified. As shown in FIG. 2, the transfer substrate 202 subsequently picks up a second set of chiplets 200 (e.g., from a different donor substrate). The locations of the chiplets within the set 200 correspond to the locations of the defective chiplets on the first donor substrate 100. The transfer substrate 202 moves this set 200 to the target substrate 102, resulting in a full set 201 of operational chiplets being located on the target substrate 102.

The present disclosure relates to, among other things, a transfer substrate with a set of transfer elements (e.g., transfer pixels) that can selectively hold a subset of micro objects. Thus, even when all of the transfer elements are in contact with an array of micro objects that is greater than the subset, only the subset will be adhere and be transferred, and the objects outside the subset will be left behind or otherwise unaffected. Similarly, the transfer substrate may be able to selectively release a subset of micro objects that are currently attached to the substrate, such that only the subset is transferred to a target even all of the transfer elements are currently holding a micro object. This process is repeatable and reversible, such that no permanent bonding is need to affect the selective holding or releasing of the objects.

Figure 3:
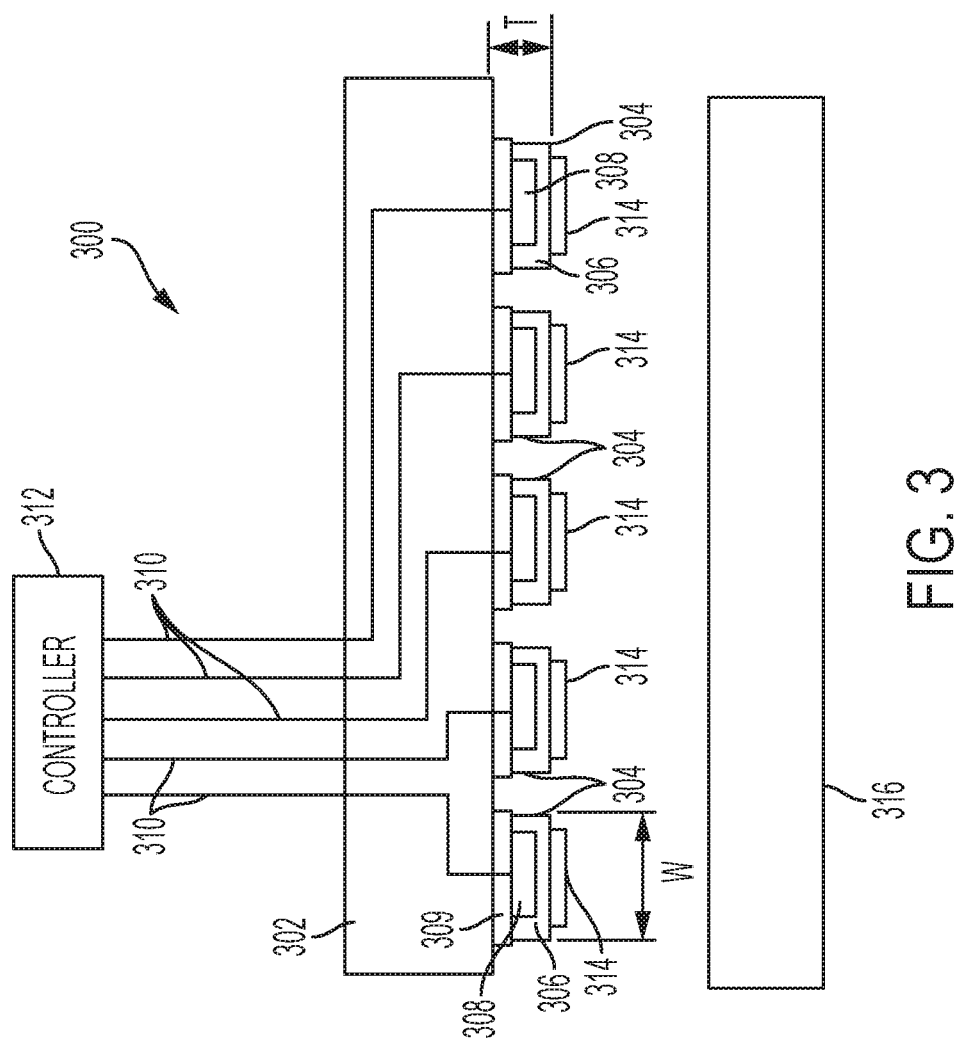
FIG. 3 is a side view of an apparatus according to an example embodiment.

In FIG. 3, a side view illustrates details of an apparatus 300 according to an example embodiment. The apparatus includes a transfer substrate 302 with two or more transfer elements 304. Each of the transfer elements 304 includes an adhesion element 306 having a first surface adhesion at a first temperature and a second surface adhesion at a second temperature. The second surface adhesion is less than the first surface adhesion. Each of the transfer elements 304 also includes a thermal element 308 operable to change a temperature of the adhesion element 306 in response to an input, e.g., via inputs 310. A controller 312 is coupled to provide the inputs 310 to the thermal elements 308, thereby causing a subset of the transfer elements 304 to selectably pick up and hold objects 314 to and (optionally) release the objects 314 from the transfer substrate 302. In particular, the objects 314 will not stick to the transfer elements 304 at the second surface adhesion but will stick at the first surface adhesion.

The apparatus 300 may be part of a micro-transfer system, which is a system used to transfer micro-objects (e.g., 1 μm to 1 mm) from the transfer substrate 302 to a target substrate 316. The adhesion element 306 may be formed of a multi-polymer that contains stearyl acrylate-based (SA). In such a case, a difference between the first and second temperatures may be less than 20° C. (where the second temperature is less than the first) in order to adjust the tackiness of the adhesion element 306 such that there is a marked difference in surface adhesion. It will be understood that some materials may lose surface adhesion at relatively higher temperatures. In such a case, the methods and apparatuses described herein may be configured such that the second temperature is greater than the first.

The thermal element 308 may include one or both of a heating element and a cooling element. The inputs 310 may include electrical signals and/or laser light. The inputs 310 may be configured (e.g., using a matrix circuit) such that there are fewer lines going to the controller 312 than the total number of transfer elements 304. The transfer elements 304 may further include a thermal insulator 309 between the adhesion element 306 and the transfer substrate 302. The insulator 309 helps prevent heat transfer to the substrate 302, thereby decreasing the amount of energy needed to affect temperature change at the adhesion element 306 and decrease response time.

Generally, the transfer elements 304 form an intermediate transfer surface whose tack can be modulated (e.g., can go from rigid to tacky) as a function of temperature. Such a surface can be used to pick up and release groups of micro-objects in a controlled and selectable manner. Each transfer element 304 may have lateral dimensions W from several micrometers to several hundreds of micrometers. Each transfer element 304 may have a total thickness T from less than one micron to several hundred microns. The pitch of the transfer array may vary from several microns to several millimeters. In some embodiment, the thermal elements 308 and insulating layers 309 are continuous layers that are not physically isolated from one another. As such, the transfer element "pixel" is the region where the heating/cooling elements can be individually addressed and controlled (see FIG. 6). The substrate 302 material may include but is not limited to glass, quartz, silicon, polymer and silicon carbide. The substrate 302 may have a thickness ranges from several tens of microns to several millimeters and lateral dimensions from several millimeters to one meter.

Note that, while the illustrated embodiments show two or more transfer elements 304, in some cases a single transfer element may be used. For example, a single transfer element 304 may be part of a manipulator that is placed at the end of a robotic arm. In such a configuration, a single transfer element 304 may be used to pick up objects without requiring the use of pincers, vacuum, magnetics, etc. In other configurations, one or more transfer elements may be placed at the ends of pincers or other holding appendages to assist in gripping without having to apply undue pressure on the object being held. As with the other embodiments, a thermal element can increase surface adhesion during holding operations, and decrease surface adhesion during releasing operations.

Phase-changing polymer comprising stearyl acrylate (SA) has been studied as a bistable electroactive polymer (BSEP) for use in the adhesion element. The BSEP polymer is a rigid polymer below its glass transition temperature (Tg). Above Tg, it becomes an elastomer that exhibits large elongation at break and high dielectric field strength. Electrical actuation can be carried out above Tg with the rubbery BSEP functioning as a dielectric elastomer. The deformation is locked when cooling down the polymer below Tg. The shape change can be reversed when the polymer is reheated above Tg.

Stearyl acrylate (octadecyl acrylate, SA) based polymers have been investigated as shape memory polymers due to their sharp phase transition between the crystalline and molten states of the stearyl moieties. The abrupt and reversible phase transition of the crystalline aggregates of the stearyl moieties results in a rapid shift between the rigid and rubbery states of the polymers during temperature cycles. The transition of SA is typically below 50° C. with a narrow phase change temperature range of less than 10° C. Therefore, SA is an ideal component for imparting a sharp rigid-to-rubbery transition. This sharp rigid-to-rubbery transition of the material was also found to correspond to a sharp non-tacky-to-tacky surface transition. Some preliminary experiments have been done to validate this characteristic.

Figure 10:
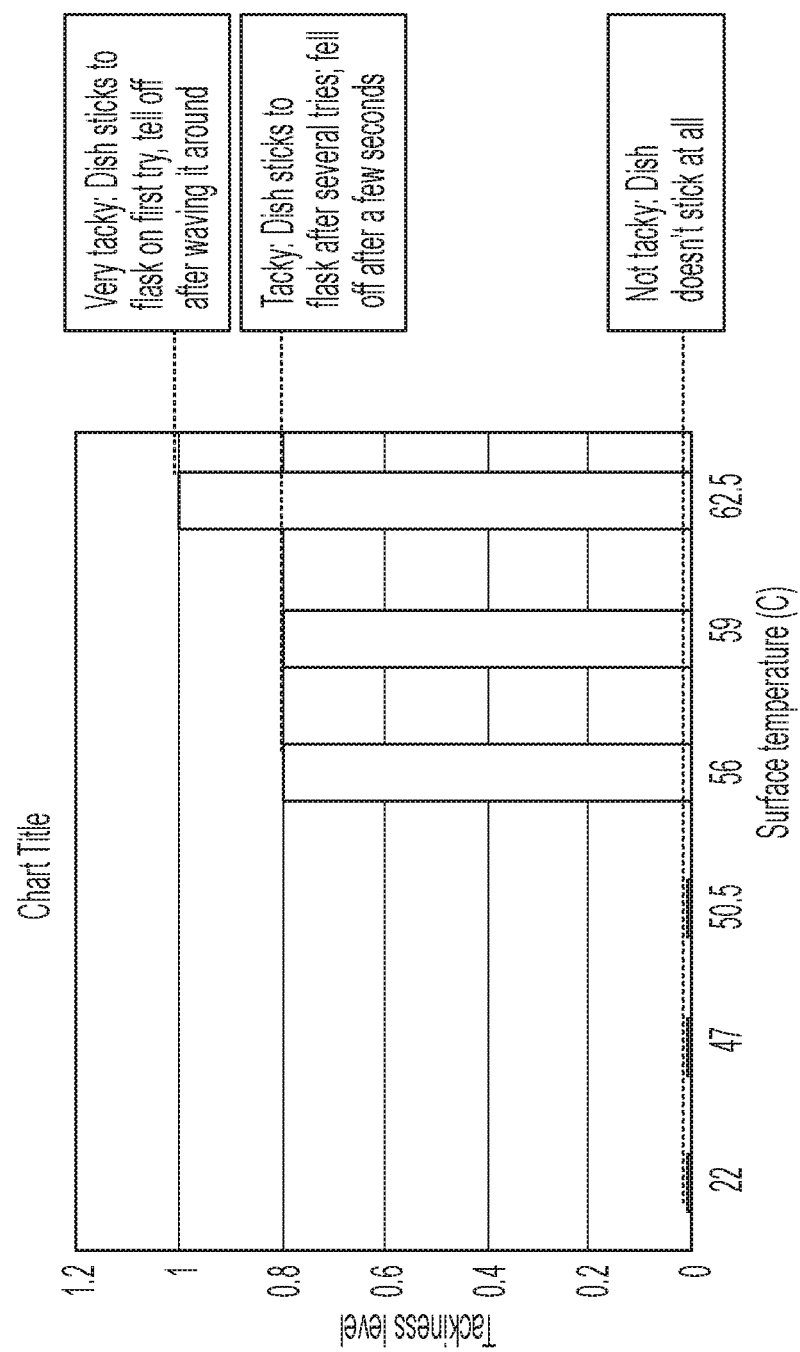
FIG. 10 is a graph showing adhesive properties of a polymer used for adhesion elements according to an example embodiment.

In one experiment, a Pyrex flask bottom was pressed onto an SA polymer in a Pyrex dish at room temperature. At room temperature, the Pyrex dish cannot be picked up and the surface of the polymer was not tacky at all. When the temperature of the polymer is elevated to ~65° C., the surface showed a strong tackiness, as a result the Pyrex dish can be picked up by the flask. The experiment is repeatable and the adhesion switching was found to be reversible. The tackiness has also been tested under different temperatures and the tackiness transition to the temperature was found to be very sharp, as shown in the graph of FIG. 10. This characteristic can be used in pick-and-place machines for micro-particles assembly, in transfer printing system for inks and tones transfer, or in a micro-assembler tool for microchips assembly, such as for assembling microLED displays. The sharp transition of the tackiness around room temperature allows the system to minimize the energy used for heating/cooling the polymers for switching the adhesion.

The adhesion element 306 may be made of materials including but not limited to stearyl acrylate (octadecyl acrylate, SA) based polymers, stearyl acrylate and urethane diacrylate copolymer or other types of polymers. The adhesion element 306 preferably has a sharp rigid-to-rubbery transition therefore the adhesion can be easily modulated with temperature change. The thermal elements 308 could be thermoelectric heating/cooling elements, resistive heaters, diode heaters, inductive heating elements, an optical heating elements, etc. The thermal elements 308 may include thin film resistors, a diode structure, and/or or high optical energy absorbing efficiency materials such as carbon black, carbon nanotubes, engineered nanoparticles, etc. The thermal insulator 309 may be made from materials such as polyimide, PDMS, parylene, glass, silicon oxide, $Al_xO_y$ and $Si_xN_y$, and combinations thereof.

Figure 5:
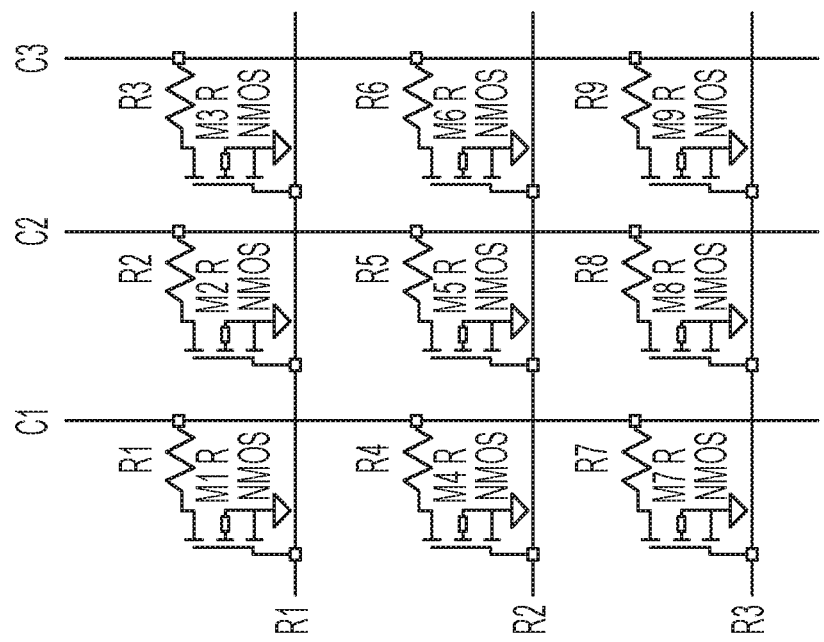
FIGS. 4 and 5 are schematic diagrams of switching matrices for a transfer substrate according to example embodiments.
Figure 4:
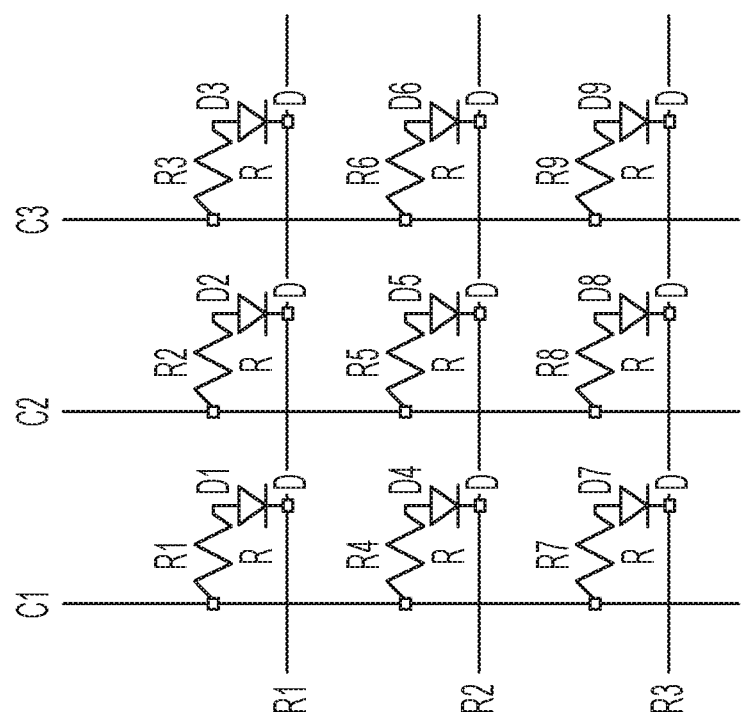

In one embodiment, the transfer substrate 302 contains an active electronics components array and the thermal elements 308 may be interconnected with them in a grid. This is shown schematically shown in FIGS. 4 and 5. The 2D array of heating elements (resistors in these examples) can be controlled by a diode as shown in FIG. 4 or a transistor as shown in FIG. 5. In the embodiment shown in FIG. 4, heating elements R1-R9 are controlled by a matrix of diodes D1-D9. This may be referred to as passive switching matrix, which reduces the number of electrical wires needed to connect the heating elements to controller chip.

In this case, the heating elements are addressed row-by-row. For example, R1 can be biased to 0V, while R2 and R3 are biased to 5V. C1, C2 and C3 bias voltage will determine if the heating elements R1, R2 or R3 is turned on (column is biased to 5V) or off (column line is biased to 0V). All the other heaters are off because of diodes blocking the current flow. The process is repeated for all the rest of rows for selected row is biased to 0V and all the other rows biased to 5V. The thermal time constant of heating elements will be designed to be longer than the "frame rate" of the 2D heater scanning to ensure quasi constant temperature is maintained for each addressable transfer.

The schematic diagram in FIG. 5 shows another circuit where the heater elements are controlled by transistors instead of diode, which may be referred to as "active matrix switching." The advantage of using transistors is that larger voltage range and better isolation can be achieved. In this case, all the rows not selected will be biased to, e.g. −5V, to turn off transistors. When a row is selected, the row line is biased to, e.g. 20V, to turn on the transistors. Biasing the column line to the specific voltage enables the corresponding heating element of the selected row to be heated to the desired temperature. Similar to the embodiment in FIG. 4, the process will be repeated for the rest of the other rows.

Figure 6:
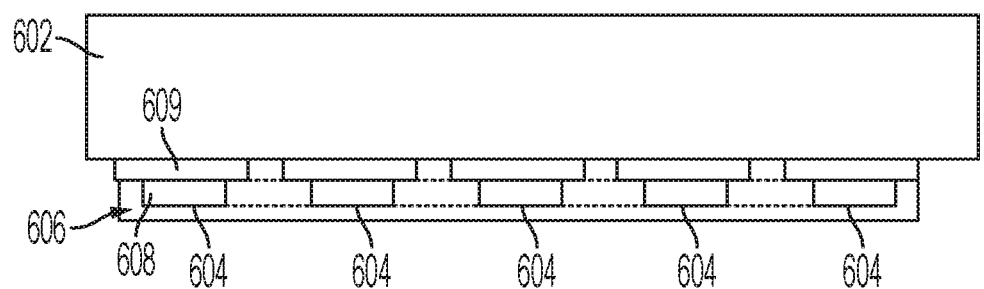
FIG. 6 is a side view of a transfer substrates according to an example embodiment.

In FIG. 6, a side view shows a transfer substrate 602 according to another example embodiment. As with the embodiment in FIG. 3, the transfer substrate 602 has two or more transfer elements 604 each including an adhesion element 606 having a surface adhesion that varies by temperature. Each of the transfer elements 604 also includes a thermal element 608 operable to change a temperature of the regional adhesion element 606 (e.g., part of element near thermal element 608) in response to an input. In this example, the adhesion element 604 is part of a continuous layer that covers more than one transfer element 604, in this case, all of the illustrated elements 604. Any of the embodiments described herein may use an adhesion element formed of a single layer that covers a plurality of element similar to what is shown in FIG. 6.

Also note that this embodiment shows the use of an insulator 609 between the transfer elements 604 and the substrate 602, although such insulators 609 may be optional. Also, as indicated by dashed lines, one or both of the thermal elements 608 and insulator 609 may be implemented as a single layer that covers more than one transfer element 604. In such an embodiment, individual signal lines (e.g., lines 310 in FIG. 3 and/or waveguides 1112 in FIG. 7) may be attached to the thermal element layer 608, such that local temperature change is induced within a region that defines the size and location of the individual transfer element 608.

Figure 7:
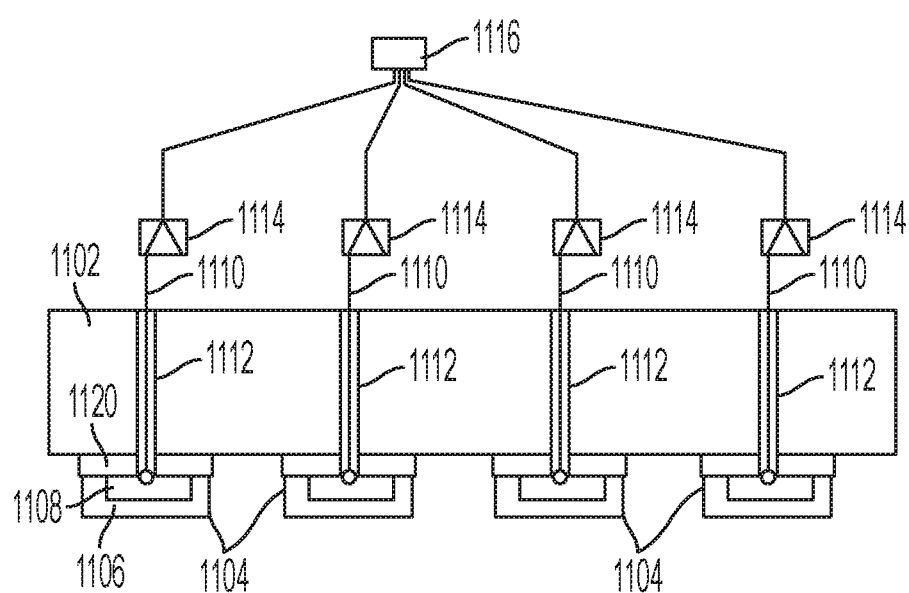
FIGS. 7 and 8 are side views of transfer substrates according to various example embodiments.

In FIG. 7, a side view shows a transfer substrate 1102 according to another example embodiment. As with the embodiment in FIG. 3, the transfer substrate 1102 has two or more transfer elements 1104 each including an adhesion element 1106 having a surface adhesion that varies by temperature. Each of the transfer elements 1104 also includes a thermal element 1108 operable to change a temperature of the adhesion element 1106 in response to an input. In this example, the thermal elements 1108 are activated by laser light 1110 which is delivered via waveguides 1112 in the substrate 1102. The light is provided from one or more lasers 1116 and may selectively activate the transfer elements 1104 via optical switching elements 1114 that absorb or redirect light away from transfer elements that are not to be heated. Note that multiple lasers 1116 may be used, as many as one per transfer element and they may be integrated in the substrate 1102 or mounted externally. The optical switches 1114 may be electrically activated, and may be arranged in a matrix similar to the diodes and transistors shown in FIGS. 4 and 5 to reduce the number of lines to the controller.

Figure 8:
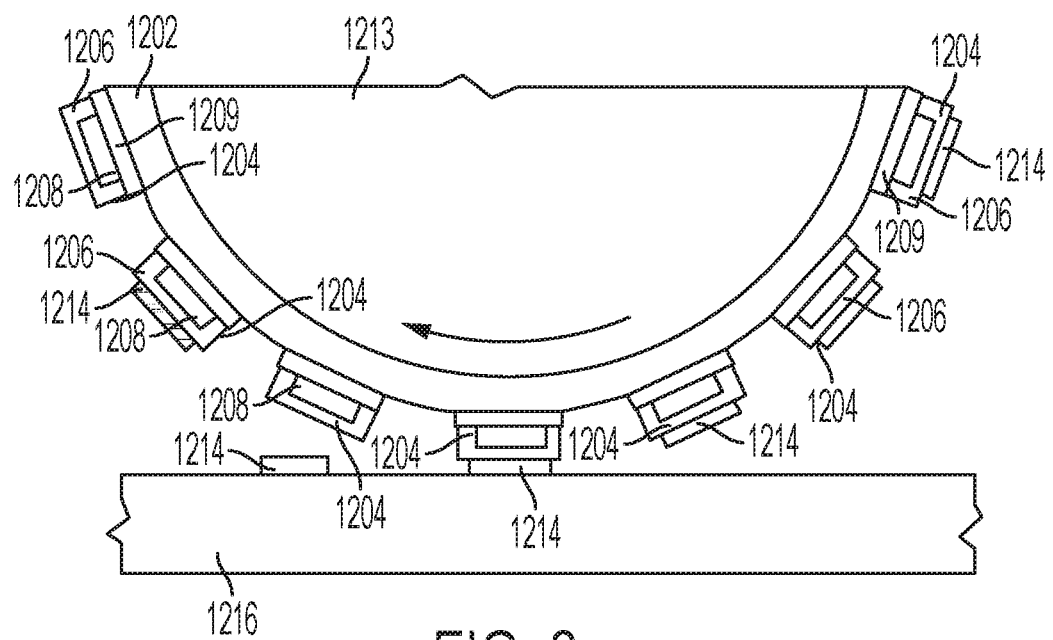

In FIG. 8, a side view shows a transfer substrate 1202 according to another example embodiment. As with the embodiment in FIG. 3, the transfer substrate 1202 has two or more transfer elements 1204 each including an adhesion element 1206 having a surface adhesion that varies by temperature. Each of the transfer elements 1204 also includes a thermal element 1208 operable to change a temperature of the adhesion element 1206 in response to an input. Each of the transfer elements 1204 also includes an insulator 1209 that thermally insulates the thermal element 1208 from the transfer substrate 1202.

In this embodiment, the transfer substrate 1202 is curved and mounted to a roller 1213 that rotates relative to a target substrate 1216. The roller 1213 and target substrate also move linearly relative to one another (horizontally in this illustration) such that only a subset of the transfer elements 1204 (e.g., a single element 1204) contacts the transfer substrate 1216 at a time. The subset of transfer elements 1204 are selectively activated to hold or release an object 1214, such that some of the objects 1214 are selectively transferred to the target substrate 1216. Note that the shaded object 1214 to the left was not transferred to the target substrate 1216. Note another part of the roller 1213 and substrate 1202 may be in contact with a donor substrate (not shown) such that the transfer of objects may be a rolling transfer process where objects 1214 are picked up from the donor and transferred to the target 1216. The roller 1213 and substrate 1202 may be in contact with the donor and target substrates at the same times, or different times. In such a case, a second transfer substrate (not shown) may be used to deposit discarded objects 1214, and this second transfer substrate may also use a curved substrate. Any of the other embodiments described herein may use a curved transfer substrate and rolling transfer process as shown in FIG. 8.

Figure 9A:
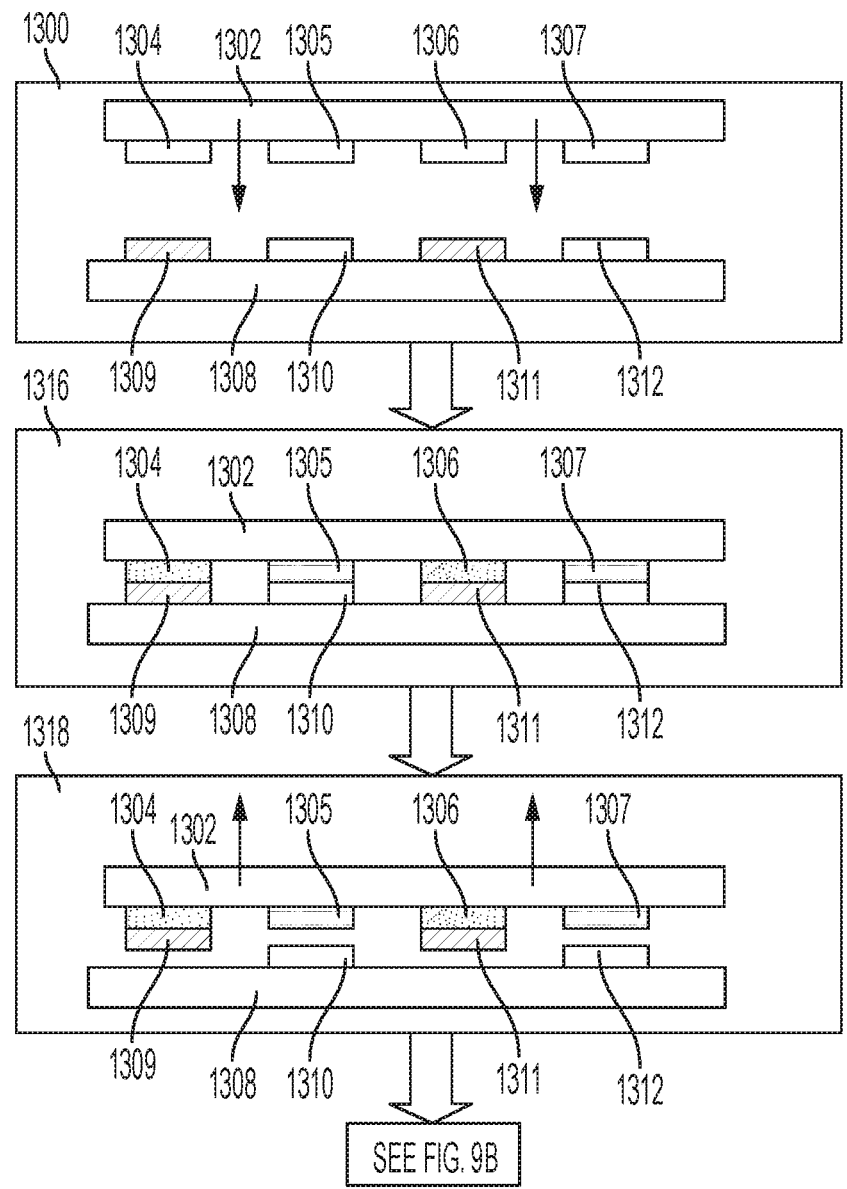
FIGS. 9A and 9B are diagrams of a method according to an example embodiment.
Figure 9B:
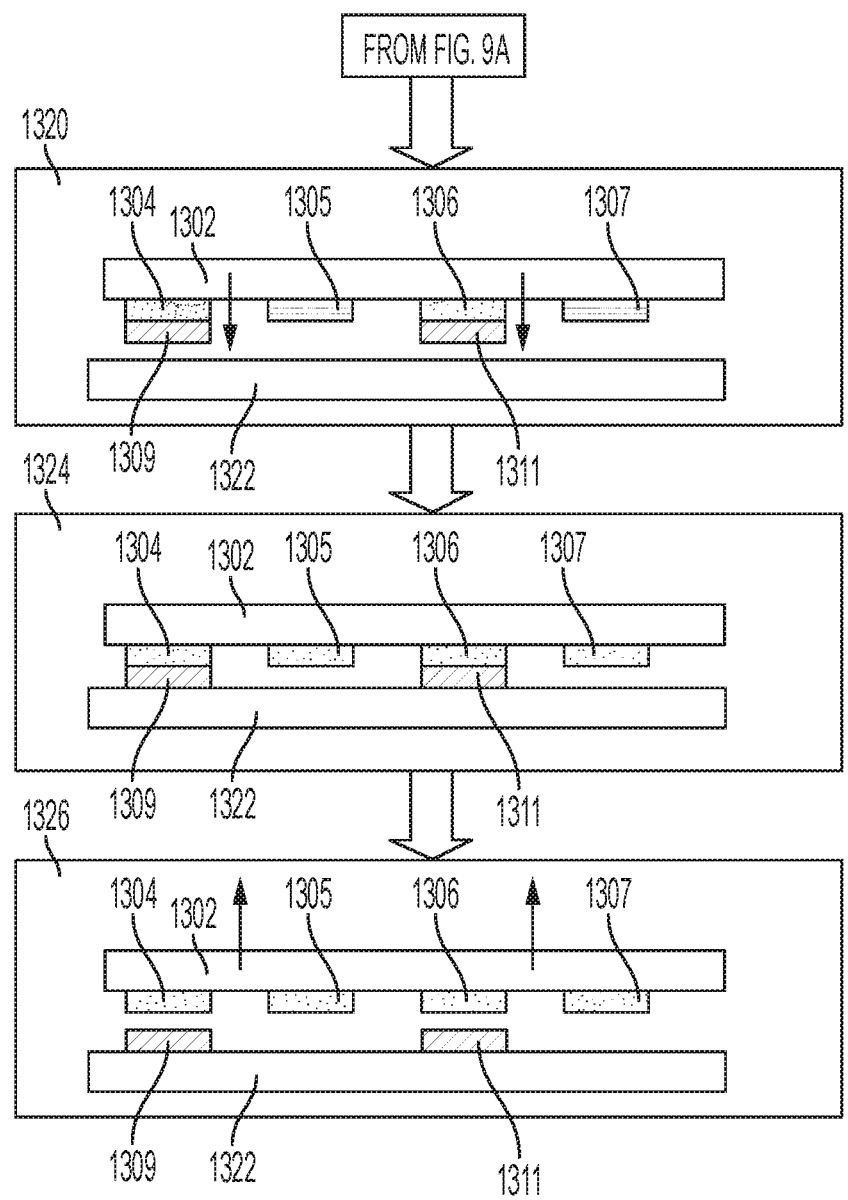

In FIGS. 9A and 9B, a block diagram shows a method according to an example embodiment. In block 1300, a transfer substrate 1302 is shown having an array of transfer elements 1304-1307. The transfer substrate 1302 is shown positioned over a donor substrate 1308 such that the array of transfer elements 1304-1307 is aligned over respective objects 1309-1312. As indicated by the shading, the objects 1309, 1311 form a subset of the objects 1309-1312 that is intended to be transferred off of the donor substrate 1308. As indicated by the arrows, the transfer substrate 1302 is moved towards the donor substrate 1308, or vice versa.

As seen in block 1316, after contact is made between the transfer elements 1304-1307 and objects 1309-1312, inputs are applied to a subset 1304, 1306 of the transfer elements 1304. The inputs causing each transfer element 1304, 1306 in the subset to achieve a first temperature such that an adhesion element of each transfer element 1304, 1306 in the subset achieves a first surface adhesion. This input may be applied before or after the subset of transfer elements 1304, 1306 contact the respective subset of objects 1309. The subset of objects 1309 that adhere to the subset of the transfer elements 1304, 1306 at the first surface adhesion.

Note that other transfer elements 1305, 1307 that are not in the subset of transfer elements 1304, 1306 are at a second temperature that results in transfer elements 1305, 1307 having a second surface adhesion. At this second surface adhesion, the other transfer elements 1305, 1307 will not adhere to respective objects 1310, 1312. Note that in the previous step shown in block 1300, the transfer elements 1304-1307 may be at any temperature, including the first and second temperature. In some embodiments, it may be desirable to have all of the elements 1304-1307 at the second temperature, or to have all of the elements 1304-1307 set to the first and second temperatures as shown in block 1316.

As seen in block 1318, the transfer substrate 1302 is moved away from the donor substrate (indicated by the arrows), causing the subset of objects 1309, 1311 to be separated from the donor substrate 1308 while the other objects 1310, 1312 remain on the donor substrate. As seen in block 1320 in FIG. 9B, the transfer substrate 1302 is aligned with and moved towards a target substrate 1322. As seen in block 1324, the subset of objects 1309, 1311 on the transfer substrate 1302 contact the target substrate 1322.

Optionally, in one or both of blocks 1324, 1326, second inputs may be applied to the subset of transfer elements 1304, 1306 causing each transfer element in the subset to achieve a second temperature such that an adhesion element of each transfer element 1304, 1306 in the subset achieves the second, lower, surface adhesion. The second surface adhesion allows the subset of objects 1309, 1311 to easily transfer to the target substrate 1322. In cases where the second temperature is cooler than the first temperature, some or all of the transfer substrate 1302 may be cooled ambient air, a thermoelectric cooler, a vapor compression cooler, and a forced convective cooling element using gas/liquid as the coolant. There may also be an inherent or actively-generated attraction between the subset of objects 1309, 1311 and the target substrate 1322 such that the objects 1309, 1311 may release at the first surface adhesion, thereby negating the need for significantly changing the temperature of the transfer elements 1304, 1306 (although it still may be beneficial to change the temperature where possible). For example, a counter force may be applied from the target substrate 1322 that includes but not limited to adhesive force, electrical force, magnetic force, and a vacuum-created force.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The various embodiments described above may be implemented using circuitry, firmware, and/or software modules that interact to provide particular results. One of skill in the arts can readily implement such described functionality, either at a modular level or as a whole, using knowledge generally known in the art. For example, the flowcharts and control diagrams illustrated herein may be used to create computer-readable instructions/code for execution by a processor. Such instructions may be stored on a non-transitory computer-readable medium and transferred to the processor for execution as is known in the art. The structures and procedures shown above are only a representative example of embodiments that can be used to provide the functions described hereinabove.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

The invention claimed is:

1. An apparatus, comprising:
   a transfer substrate, comprising two or more transfer elements, each of the transfer elements comprising:
      an adhesion element having a first surface adhesion at a first temperature and a second surface adhesion at a second temperature, the second surface adhesion less than the first surface adhesion; and
      a thermal element operable to change a temperature of the adhesion element in response to an input; and
   a controller coupled to provide the inputs to the thermal elements of the two or more transfer elements to cause a subset of the transfer elements to selectably hold objects to and release the objects from the transfer substrate in response to changes between the first and second surface adhesion of the subset of the transfer elements, wherein the changes between the first and second surface adhesion are repeatable and reversible.

2. The apparatus of claim 1, wherein the objects comprise sub-millimeter electronic devices.

3. The apparatus of claim 1, wherein the two or more transfer elements comprise an array of transfer elements spaced at a pitch between 1 μm and 1 mm.

4. The apparatus of claim 1, wherein the adhesion element is formed of a multi-polymer that contains stearyl acrylate (SA) polymer.

5. The apparatus of claim 1, wherein a difference between the first and second temperatures is less than 20° C.

6. The apparatus of claim 1, wherein the thermal element comprises a heating element.

7. The apparatus of claim 6, wherein the heating element comprises a resistive heating element.

8. The apparatus of claim 1, wherein the thermal element comprises a cooling element.

9. The apparatus of claim 1, wherein the inputs comprise electrical signals.

10. The apparatus of claim 1, wherein the inputs comprise laser light.

11. The apparatus of claim 1, wherein the transfer elements further comprise a thermal insulator between the adhesion element and the transfer substrate.

12. The apparatus of claim 1, wherein the adhesion elements of the two or more transfer elements comprise a continuous layer that covers all of the two or more transfer elements.

13. The apparatus of claim 1, wherein the adhesion element is tacky at the first temperature and rigid at the second temperature.

14. The apparatus of claim 1, wherein the transfer elements are implemented on a curved substrate or a roller.

15. A method comprising:
    applying first inputs to a subset of a plurality of transfer elements on a transfer substrate, each of the plurality of transfer elements having a thermal element and an adhesion element thermally coupled to the adhesion element, the first inputs causing each transfer element in the subset of transfer elements to achieve a first temperature such that each adhesion element of each transfer element in the subset achieves a first surface adhesion, wherein other transfer elements not in the subset are at a second temperature that causes each adhesion element of the other transfer elements to achieve a second surface adhesion less than the first surface adhesion, wherein changing between the first and second surface adhesion is repeatable and reversible;
    causing at least the subset of the transfer elements to contact a respective subset of objects of a plurality of objects on a donor substrate;
    moving the transfer substrate away from the donor substrate, the subset of objects adhering to the subset of transfer elements at the first surface adhesion and moving with the transfer substrate;
    causing the subset of objects on the transfer substrate to contact a target substrate; and
    transferring the subset of objects from the transfer substrate to the target substrate.

16. The method of claim 15, wherein causing at least the subset of the transfer elements to contact the respective subset of objects comprises causing all of the plurality of transfer elements to contact all of the respective plurality of objects on the donor substrate, and wherein other objects contacted by the other transfer elements do not adhere to the transfer substrate and do not move with the transfer substrate.

17. The method of claim 15, wherein transferring the subset of objects from the transfer substrate to the target substrate comprises causing the subset of transfer elements to achieve a second temperature such that the adhesion element of each transfer element in the subset achieves the second surface adhesion.

18. The method of claim 15, wherein the target substrate applies a counter force that facilitates transferring the subset of objects from the transfer substrate to the target substrate.

19. A method comprising:
    causing a plurality of transfer elements to contact a corresponding plurality of objects on a donor substrate, each of the transfer elements comprising: an adhesion element having a first surface adhesion at a first temperature and a second surface adhesion at a second temperature, the second surface adhesion less than the first surface adhesion; and a thermal element operable to change a temperature of the adhesion element to repeatably and reversibly change between the first and second surface adhesions;
    applying first inputs to the thermal elements of a subset of a plurality of the transfer elements causing the adhesion element of each transfer element in the subset of transfer elements to achieve the first surface adhesion, wherein the adhesion element of other transfer elements not in the subset are the second surface adhesion;
    moving the transfer substrate away from the donor substrate such that a corresponding subset of objects adhere to the subset of transfer elements and move with the transfer substrate;
    causing the subset of objects on the transfer substrate to contact a target substrate; and
    transferring the subset of objects from the transfer substrate to the target substrate.

20. The method of claim 19, wherein transferring the subset of objects from the transfer substrate to the target substrate comprises causing the subset of transfer elements to achieve the second surface adhesion.

21. The method of claim 19, wherein the target substrate applies a counter force that facilitates transferring the subset of objects from the transfer substrate to the target substrate.

* * * * *